United States Patent
Grant et al.

(10) Patent No.: US 12,046,511 B2
(45) Date of Patent: Jul. 23, 2024

(54) SELECTIVE METAL RESIDUE AND LINER CLEANSE FOR POST-SUBTRACTIVE ETCH

(71) Applicant: International Business Machines Corporation, Armonk, NY (US)

(72) Inventors: Devika Sarkar Grant, Rensselaer, NY (US); Somnath Ghosh, Clifton Park, NY (US)

(73) Assignee: International Business Machines Corporation, Armonk, NY (US)

(*) Notice: Subject to any disclaimer, the term of this patent is extended or adjusted under 35 U.S.C. 154(b) by 251 days.

(21) Appl. No.: 17/530,971

(22) Filed: Nov. 19, 2021

(65) Prior Publication Data
US 2023/0163029 A1  May 25, 2023

(51) Int. Cl.
| | |
|---|---|
| *H01L 21/768* | (2006.01) |
| *H01L 21/02* | (2006.01) |
| *H01L 21/311* | (2006.01) |
| *H01L 21/3213* | (2006.01) |
| *H01L 23/532* | (2006.01) |

(52) U.S. Cl.
CPC .. *H01L 21/76885* (2013.01); *H01L 21/02071* (2013.01); *H01L 23/53266* (2013.01); *H01L 21/31111* (2013.01); *H01L 21/32134* (2013.01); *H01L 21/32135* (2013.01)

(58) Field of Classification Search
None
See application file for complete search history.

(56) References Cited

U.S. PATENT DOCUMENTS

| | | |
|---|---|---|
| 7,018,552 B2 | 3/2006 | Uematsu et al. |
| 7,320,942 B2 | 1/2008 | Chen et al. |
| 7,838,428 B2 | 11/2010 | Chen et al. |
| 8,357,609 B2 | 1/2013 | Ryan |
| 8,871,650 B2 | 10/2014 | Nemani et al. |
| 8,916,939 B2 | 12/2014 | Yu et al. |
| 10,177,031 B2 | 1/2019 | Bao et al. |
| 2002/0119245 A1 | 8/2002 | Verhaverbeke |

(Continued)

FOREIGN PATENT DOCUMENTS

| | | |
|---|---|---|
| WO | 02/10480 A3 | 10/2002 |
| WO | 2006/113621 A3 | 3/2007 |

OTHER PUBLICATIONS

Paolillo, S., et al., "Direct metal etch of ruthenium for advanced interconnect", Journal of Vacuum Science & Technology (2018), Accepted Apr. 2, 2018, Published Online May 2, 2018, p. 03E103-1-03E103-9, B 36.

*Primary Examiner* — Alexander G Ghyka
(74) *Attorney, Agent, or Firm* — Scully, Scott, Murphy & Presser, P.C.; Samuel Waldbaum

(57) ABSTRACT

Structures in semiconductor devices, and methods for forming the structures, are described. In one embodiment, a hard mask layer of a deposition stack can be etched to pattern a hard mask. An interconnect layer of the deposition stack can be etched using the hard mask to pattern a plurality of metal lines. The hard mask can be removed. A liner layer of the deposition stack can be etched to remove a portion of the liner layer deposited directly on a dielectric layer of the deposition stack. In response to etching the liner layer, a remaining portion of the liner layer can be deposited between the metal lines and the dielectric layer.

11 Claims, 7 Drawing Sheets

(56) References Cited

U.S. PATENT DOCUMENTS

| | | | |
|---|---|---|---|
| 2007/0278584 A1* | 12/2007 | Colombo | H01L 21/02068 257/369 |
| 2009/0096007 A1* | 4/2009 | Omura | H10B 69/00 257/E21.209 |
| 2010/0122711 A1 | 5/2010 | Ryan | |
| 2015/0200042 A1 | 7/2015 | Ling et al. | |
| 2017/0263557 A1* | 9/2017 | Clevenger | H01L 23/53266 |
| 2019/0157106 A1* | 5/2019 | Joseph | H01L 21/32136 |

* cited by examiner

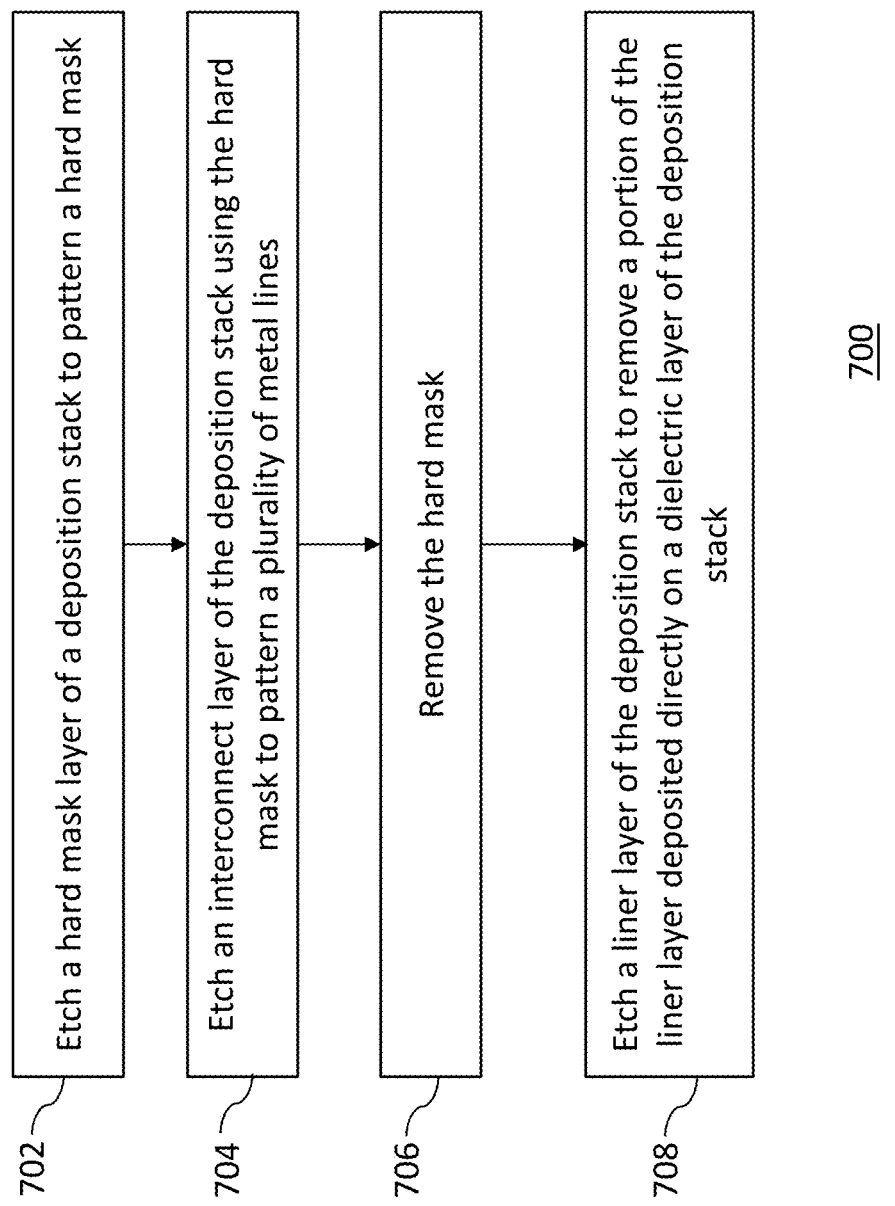

SELECTIVE METAL RESIDUE AND LINER CLEANSE FOR POST-SUBTRACTIVE ETCH

BACKGROUND

The present disclosure relates in general to semiconductor devices and methods of manufacturing semiconductor devices and, in particular, to selectively remove metal residue and liners of interconnects in a post-subtractive etch stage during fabrication of semiconductor devices.

Integrated circuits (IC) include interconnect structures having electrically conductive wires that connect devices in different levels of a semiconductor chip to each other. Fabrication of an IC can include a front-end-of-line (FEOL) portion and a back-end-of-line (BEOL) portion. The FEOL portion can include patterned individual devices such as transistors, capacitors, resistors, etc., and other steps leading up to, but not including, deposition of metal interconnect layers and patterning metal interconnect structures (e.g., metal conducting lines). The BEOL portion can include interconnect structures and vias connected to the metal interconnect structures to connect the individual devices patterned from the FEOL portion with other layers above the FEOL and BEOL portions.

SUMMARY

In an embodiment, a structure in a semiconductor device is generally described. The structure can include a substrate, a dielectric layer deposited directly on the substrate, and a plurality of interconnect structures deposited directly on the dielectric layer. Each interconnect structure can include a liner deposited between a metal line of the interconnect structure and the dielectric layer, and residues of the liner can be absent on sidewalls of the interconnect structures.

In another embodiment, a method for forming interconnect structures on a semiconductor device is generally described. The method can include etching a hard mask layer of a deposition stack to pattern a hard mask. The method can further include etching an interconnect layer of the deposition stack using the hard mask to pattern a plurality of metal lines. The method can further include removing the hard mask. The method can further include etching a liner layer of the deposition stack to remove a portion of the liner layer deposited directly on a dielectric layer of the deposition stack. In response to etching the liner layer, a remaining portion of the liner layer can be deposited between the metal lines and the dielectric layer.

In another embodiment, a semiconductor device is generally described. The semiconductor device can include a back end of line (BEOL) portion and a front end of line (FEOL) portion connected to the BEOL portion. The FEOL portion can include a structure that includes a substrate, a dielectric layer deposited directly on the substrate, and a plurality of interconnect structures deposited directly on the dielectric layer. Each interconnect structure can include a liner deposited between a metal line of the interconnect structure and the dielectric layer, and residues of the liner can be absent on sidewalls of the interconnect structures.

Further features as well as the structure and operation of various embodiments are described in detail below with reference to the accompanying drawings. In the drawings, like reference numbers indicate identical or functionally similar elements.

BRIEF DESCRIPTION OF THE DRAWINGS

FIG. 7 is a flow diagram illustrating a method of selective metal residue and liner cleanse for post-subtractive etch in one embodiment.

DETAILED DESCRIPTION

Figure 1:
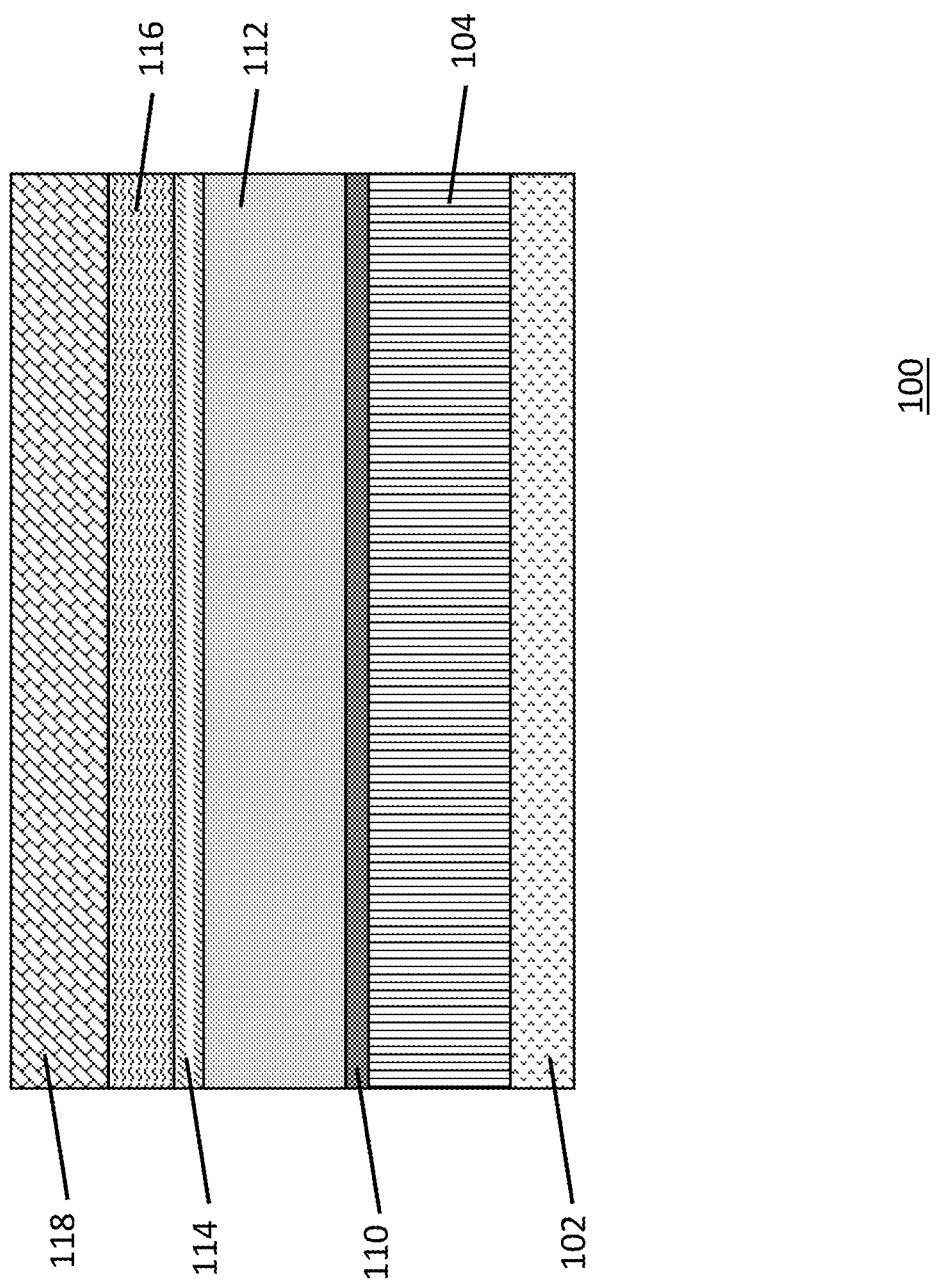
FIG. 1 is a cross sectional view of an exemplary structure that can be used in selective metal residue and liner cleanse for post-subtractive etch in one embodiment.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following descriptions, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The metal interconnect structures formed on a top layer (e.g., the last metal layer) of the FEOL portion can be metal interconnects insulated by dielectric materials. A top via scheme can be used for fabricating these metal interconnect structures beyond a specific line pitch (e.g., 28 nanometer (nm) line pitch). Top via schemes can include subtractive etching of metals, such as ruthenium (Ru), Rhodium (Rh), Molybdenum (Mo), Niobium (Nb), Iridium (Ir), and/or other conductive materials that can form the interconnects. In an embodiment, a liner can be used as an adhesion layer to connect these metal interconnect on dielectric layers, and these liners may undergo etching, such as reactive-ion etching (RIE). To be described in more detail below, the methods described herein can provide selective etching on the liners, which can prevent punching through the liners and prevent damages to dielectric layers underneath the liners, where damages to the dielectric layers can increase the dielectric constant. Further, upon the etching, metal residues from the etching can be cleansed or removed to prevent contamination of the IC.

Further, the methods described herein can provide a complete post RIE cleanse or cleansing to remove metal oxide from surfaces of the metal interconnects. The methods described here can provide a relatively effective post RIE cleanse process by 1) removing all metallic etch residues, 2) removing any remaining hard mask, 3) removing any thin metal oxidized from the metal trenches (e.g., in spacing between formed metal interconnects), 4) selectively removing TaN liners without undercutting and damaging underlying dielectric layers, and 5) preventing flopover of sub etch metal lines from wet cleansing processes.

Patterning processes can include additive and subtractive patterning processes. Additive patterning refers to patterning involving the addition of material to a device (e.g., by selective deposition), while subtractive patterning refers to patterning involving the removal of material from a device (e.g., using an etch process). As metal pitches become smaller and pitch lines become thinner, subtractive patterning schemes can become attractive due to factors such as a lack of conductive liner requirement and resistance benefits. The embodiments described herein can provide a subtractive patterning scheme that can selectively remove metal residue and metal liners from sidewalls of metal interconnect structures during fabrication of semiconductor devices.

FIG. 1 is a cross sectional view of an exemplary structure 100 that can be used in selective metal residue and liner cleanse for post-subtractive etch in one embodiment. The structure 100 can be a deposition stack including a substrate 102, a dielectric region 104, a liner layer 110, an interconnect layer 112, an etch stop layer 114, a cap layer 116, and a hard mask layer 118. The substrate 102 can be, for example, a silicon (Si) wafer. The dielectric region 104 can include one or more layers of dielectric materials such as silicon nitride (SiN), silicon oxide (SiO), silicon dioxide (SiO$_2$), tetraethyl orthosilicate (TEOS), and/or other dielectric materials. The dielectric region 104 can be deposited directly on the substrate 102. The liner layer 110 can be formed by, for example, depositing material such as tantalum nitride (TaN) directly on the dielectric region 104. The interconnect layer 112 can be formed by, for example, depositing material such as ruthenium (Ru) directly on the liner layer 110. The etch stop layer 114 can be formed by, for example, depositing material such as silicon carbide nitride (SiCN) directly on the interconnect layer 112. The cap layer 116 can be formed by, for example, depositing material such as tetraethyl orthosilicate (TEOS) directly on the etch stop layer 114. In an embodiment, the etch stop layer 114 can be an adhesion layer between the interconnect layer 112 and the cap layer 116. The hard mask layer 118 can be formed by, for example, depositing material such as silicon nitride (SiN) directly on the cap layer 116. In one embodiment, the liner layer 110 can be approximately 3 nanometers (nm) thick, the interconnect layer 112 can be approximately 30 nm thick, the etch stop layer 114 can be approximately 4 nm to 5 nm thick, and the hard mask layer 118 can be approximately 5 nm thick.

Figure 2:
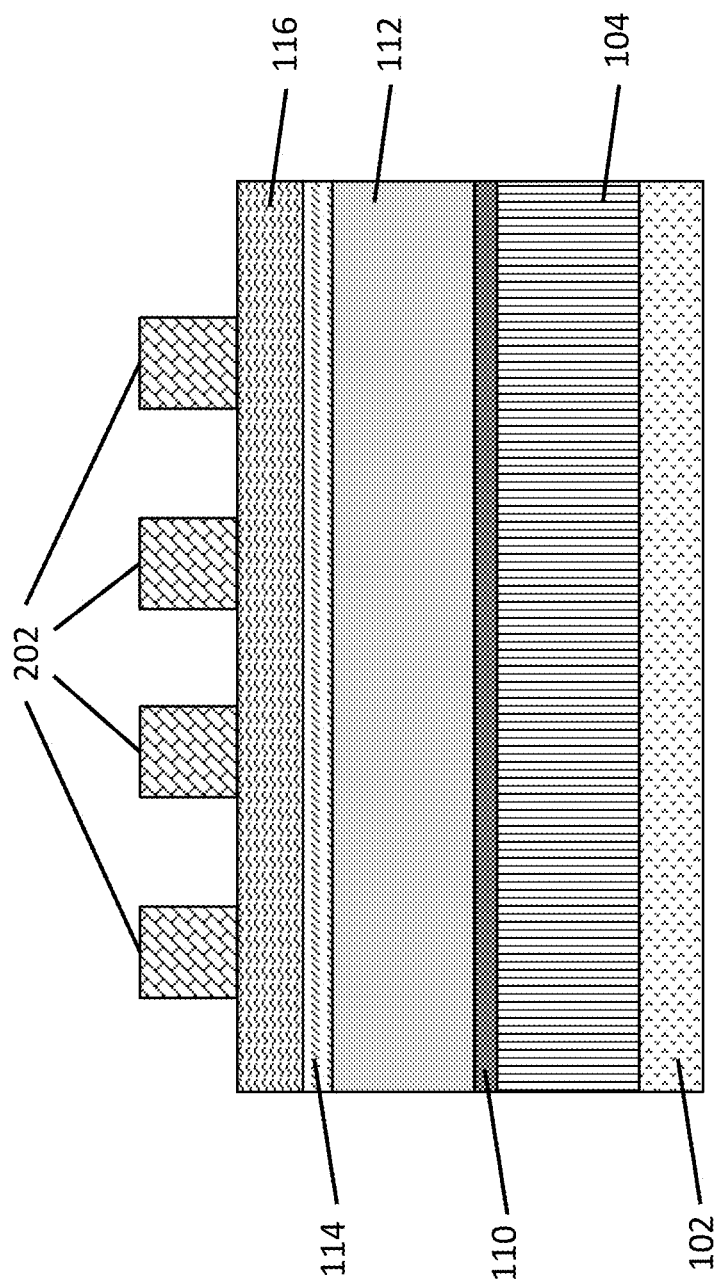
FIG. 2 is a cross sectional view of the exemplary structure of FIG. 1 after patterning a hard mask layer in one embodiment.

FIG. 2 is a cross sectional view of the exemplary structure 100 of FIG. 1 after patterning a hard mask layer in one embodiment. In one embodiment, the structure 100 in FIG. 1 can undergo a patterning process to form another structure 200. To form the structure 200, the structure 100 can undergo a metal patterning process to etch or pattern the hard mask layer 118 into a plurality of hard mask structures 202. In one embodiment, the hard mask layer 118 can be patterned into the hard mask structures 202 using a photoresist and various etching processes such as different types of dry and/or wet etch processes, such as reactive-ion etching (RIE). The hard mask structures 202 can be located or deposited directly on the cap layer 116. In another embodiment, if the hard mask layer 118 is not deposited on the cap layer 116, the hard mask structures 202 can be directly patterned or formed on top of the cap layer 116.

Figure 3:
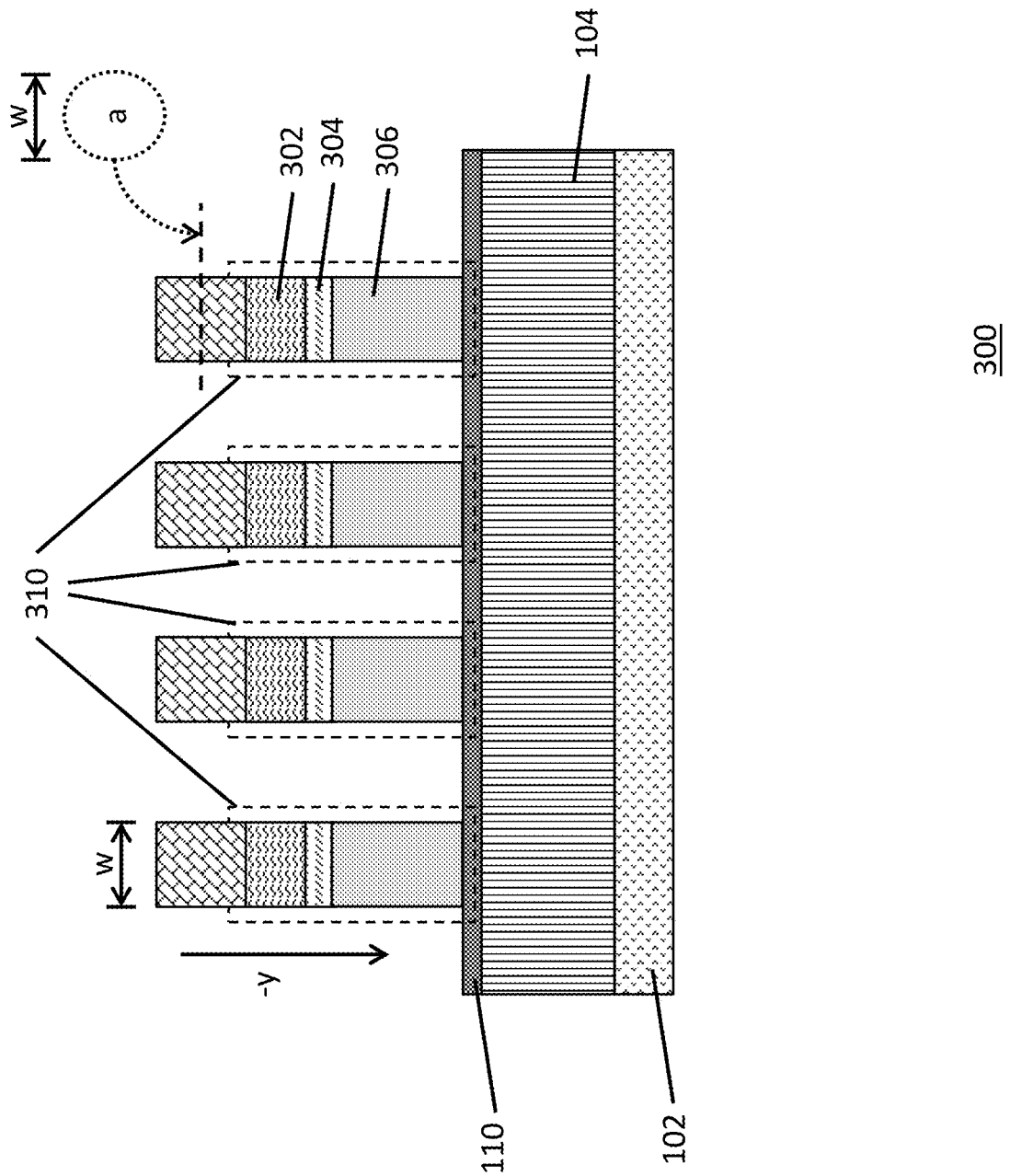
FIG. 3 is a cross sectional view of the exemplary structure of FIG. 2 after patterning an interconnect layer to form free standing metal lines in one embodiment.

FIG. 3 is a cross sectional view of the exemplary structure of FIG. 2 after patterning an interconnect layer to form free standing metal lines in one embodiment. In one embodiment, the structure 200 in FIG. 2 can undergo an etch process to form another structure 300. To form the structure 300, the hard mask structures 202 can be used in the etch process to etch and pattern the interconnect layer 112, the etch stop layer 114, and the cap layer 116 into a plurality of etched structures 310. Each one of the etched structures 310 can include a cap layer portion 302 etched from the cap layer 116, a etch stop layer portion 304 etched from the etch stop layer 114, and a metal line 306 etched from the interconnect layer 112. The metal lines 306 can be free standing Ru metal lines directly on the liner layer 110. In one embodiment, the etch process to etch and pattern the interconnect layer 112, the etch stop layer 114, and the cap layer 116 can be a dry etch process and anisotropic, and in a vertical direction (-y), such that the etched structures 310 can have the same size (e.g., a width or diameter (w), or a cross-sectional area (a)) as the mask structures 202.

Figure 4:
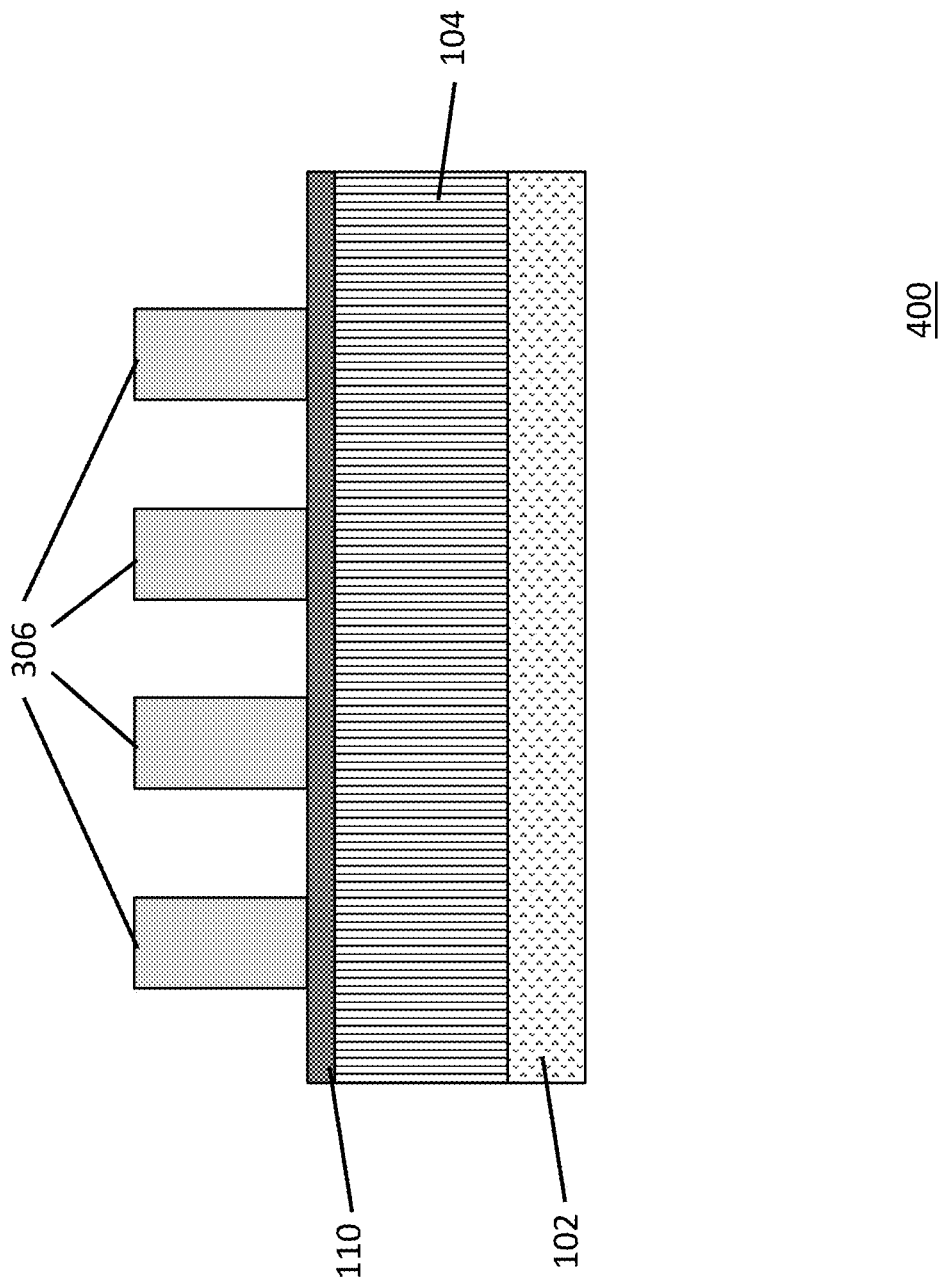
FIG. 4 is a cross sectional view of the exemplary structure of FIG. 3 after removing a hard mask on top of the free standing metal lines in one embodiment.

FIG. 4 is a cross sectional view of the exemplary structure of FIG. 3 after removing a hard mask on top of the free standing metal lines in one embodiment. In one embodiment, the structure 300 in FIG. 3 can undergo an etching process to form another structure 400. To form the structure 400, the structure 300 can undergo a wet etch process to remove the hard mask structure 202, the cap layer portion 302, and the etch stop layer portion 304 from each one of the etched structures 310. In one embodiment, the wet etch process can be a timed wet cleanse process using diluted hydrofluoric (DHF) that is diluted at a ratio of, for example, 1:300. In response to removing the hard mask structure 202, the cap layer portion 302, and the etch stop layer portion 304, from each one of the etched structures 310, the metal lines 306 remain directly on the liner layer 110.

In one embodiment, a duration of the wet etch process being applied on the structure 300 can change the amount of the etch stop layer portion 304 being removed from the etched structures 310. For example, the longer the structure 300 is exposed to the wet etch process, the more materials of the etch stop layer portion 304 disposed directly on the metal lines 306 can be removed. The duration of wet etch process can be controlled or programmed based on a size (e.g., length, width, thickness, surface area, etc.) of the etch stop layer portion 304. For example, the duration of the wet etch process can be increased for thicker etch stop layer portion 304. In one embodiment, the duration of the wet etch process, for a 4 nm to 5 nm etch stop layer 114, can be approximately 3 minutes to 6 minutes. In one embodiment, the duration of the wet etch process can vary with a thickness of a liner adhesive layer, such as the etch stop layer 114.

Figure 5:
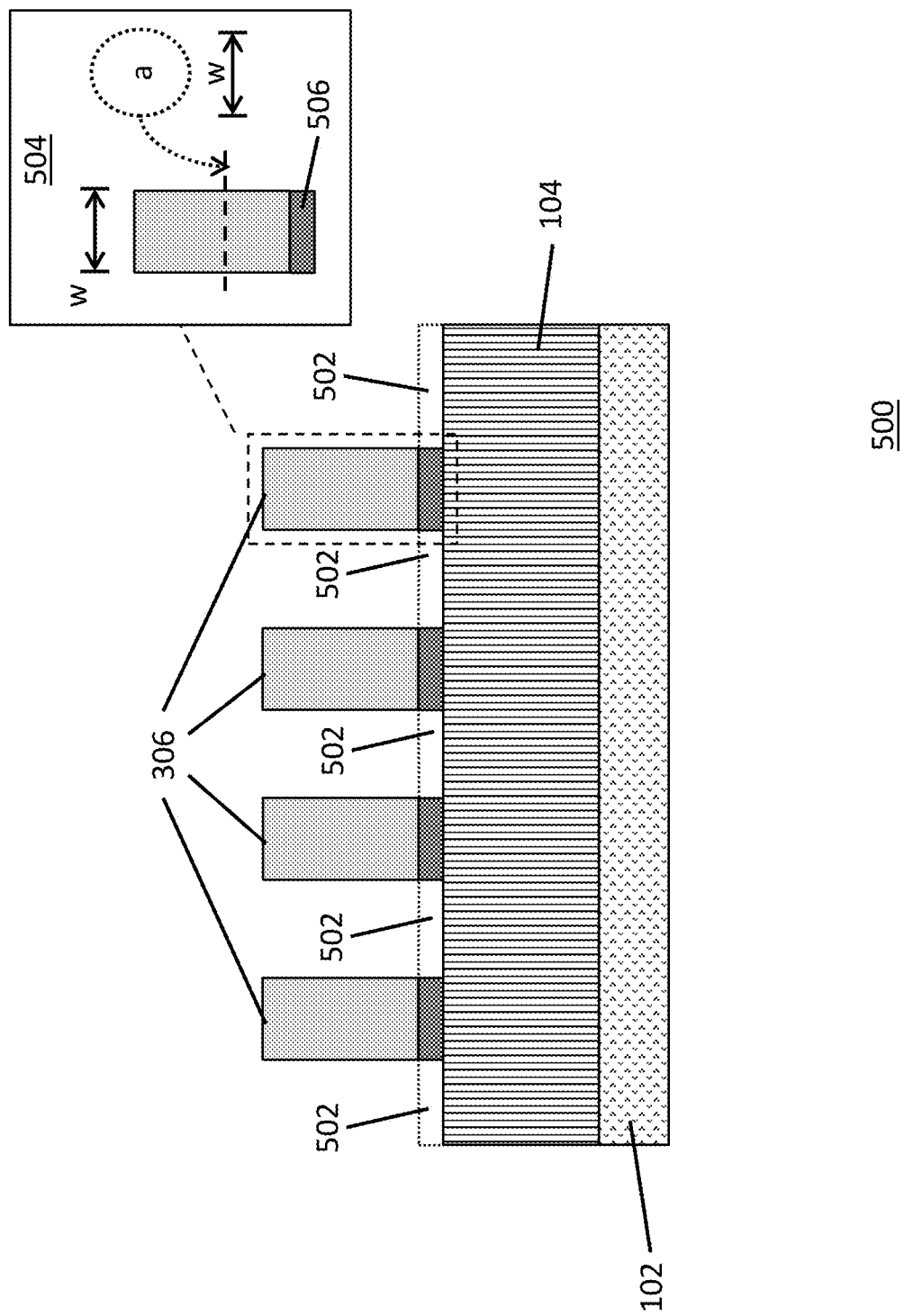
FIG. 5 is a cross sectional view of the exemplary structure of FIG. 4 after removing portions of a liner between the free standing metal lines in one embodiment.

FIG. 5 is a cross sectional view of the exemplary structure of FIG. 4 after removing portions of a liner between the free standing metal lines in one embodiment. In one embodiment, the structure 400 in FIG. 4 can undergo a selective wet etch process to form another structure 500. To form the structure 500, the structure 400 can undergo the selective wet etch process to remove portions 502 of the liner layer 110 between the metal lines 306. In one embodiment, the selective wet etch process can be selective such that the materials of the liner layer 110 (e.g., TaN) can be etched at a faster rate when compared to an etch rate of the metal lines 306. For example, to selectively etch the liner layer 110, the etch rate for the materials forming the liner layer 110 (e.g., TaN) can be a non-zero value and the etch rates for the materials forming the other layers and/or structures (e.g., Ru, SiCN, TEOS) can be zero. Further, the selective wet etch process can be isotropic such that the materials of the liner 110 (e.g., TaN) may not remain in the regions indicated by portions 502.

In one embodiment, a duration of the selective wet etch process being applied on the structure 400 can change the amount of the liner layer 110 being removed from the portions 502. For example, the longer the structure 400 is exposed to the selective wet etch process, the more materials of the liner layer 110 in the portions 502 can be removed. The duration of selective wet etch process can be controlled or programmed based on a size (e.g., length, width, thickness, surface area, etc.) of the liner layer 110. For example, the duration of the selective wet etch process can be increased for thicker liner layer 110. In one embodiment, the duration of the selective wet etch process, for a 3 nm liner layer 110, can be approximately 3 to 6 minutes. In one embodiment, the liner layer 110 can become oxidized in response to etching of the interconnect layer 112 (e.g., etching Ru), and a minimum duration (e.g., 3 minutes) can be set for ensuring removal of oxidized liner materials.

In response to removing the portions 502, a plurality of interconnect structures 504 can be formed. Each one of the interconnect structures 504 can include the metal line 306 and a remaining liner portion 506. Based on the selective and/or anisotropic wet etch process, the remaining liner portion 506 can have the same width (w) or cross-sectional area (a) as the metal line 306. The selective wet etch process can provide a thorough cleanse process to remove portions 502 of the liner layer 110, such that the materials of the liner layer 110 can be removed from the dielectric region 104 without damaging the dielectric region 104 and without undercutting the metal lines 306. Also, the selective and anisotropic wet etch process can provide a thorough cleanse process to prevent the materials of the liner layer 110 to remain on sidewalls of the metal lines 306 in the interconnect structures 504.

In one embodiment, residual metal oxides from the etching of the interconnect layer 112 (e.g., Ru) can remain on surfaces (e.g., top surface of the metal lines 306) of the structure 500. The structure 500 can undergo a hydrogen anneal process to reduce or remove the residual metal oxide on surfaces of the structure 500, such as a top surface of the metal lines 306. In one embodiment, the structure 500 can undergo the hydrogen anneal process for an amount of time that may provide optimum grain growth, such as approximately two hours. The hydrogen anneal process can remove any residual metal oxide on surfaces of the structure 500, such that metal oxide can be absent from the surfaces of the structure 500.

Figure 6:
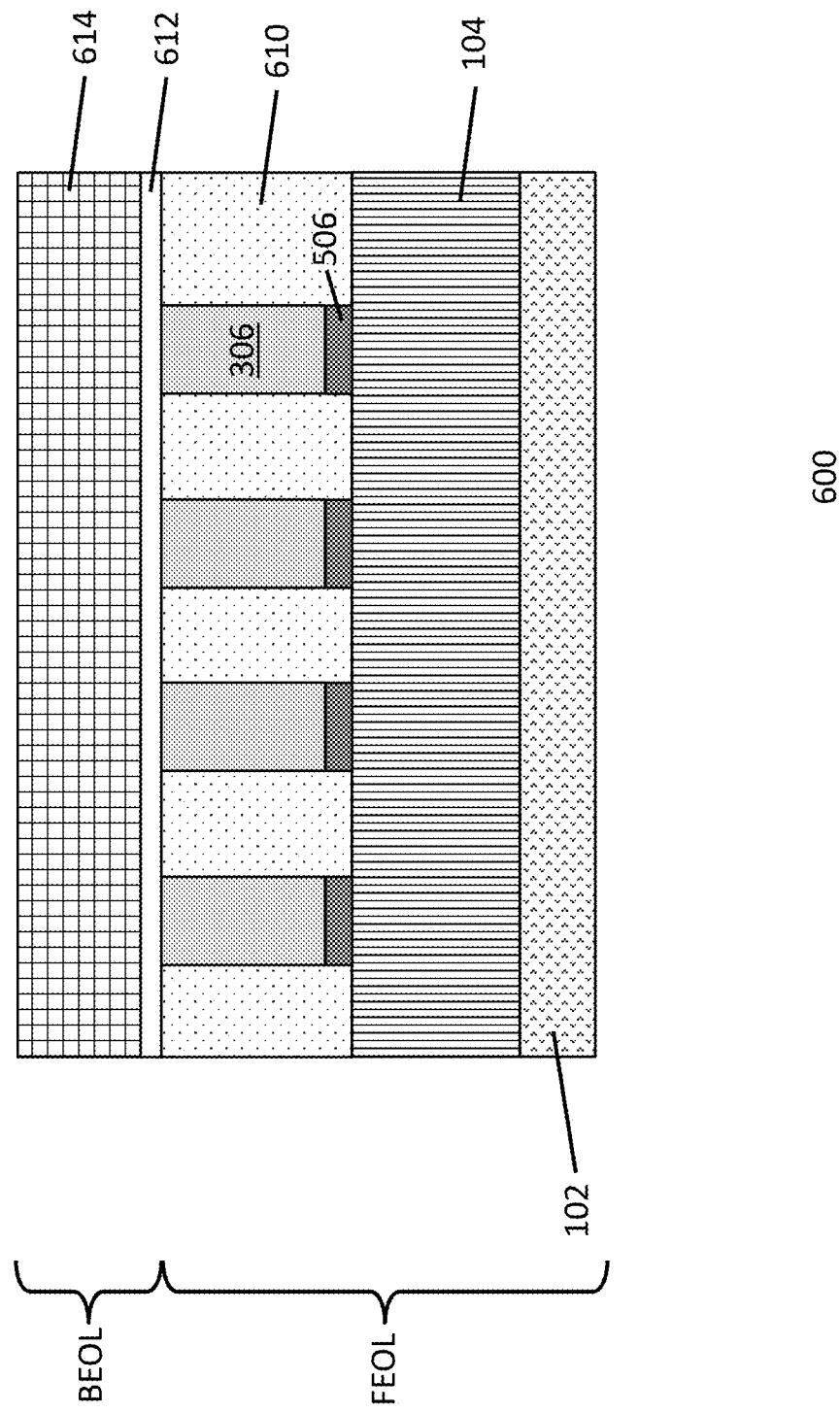
FIG. 6 is a diagram illustrating an example application of the structure of FIG. 5 in one embodiment.

FIG. 6 is a diagram illustrating an example application of the structure 500 of FIG. 5 in one embodiment. In one or more embodiments, the structure 500 of FIG. 5 can be a part of a FEOL portion of a semiconductor device 600. In response to forming the structure 500, an organic planarization layer (OPL) 610 can be formed to provide surface planarity for additional layers of material to be deposited directly on the FEOL portion. In one or more embodiments, the OPL 610 can be formed by materials such as photoresist and/or other hard mask materials. A barrier layer 612 can be deposited directly on the OPL 610, and a dielectric layer 614 can be deposited directly on the barrier layer 610. The barrier layer 612 and the dielectric layer 614 can be parts of a BEOL portion of the semiconductor device 600. The BEOL portion of the semiconductor device 600 can include additional layers above the dielectric layer 614.

FIG. 7 is a flow diagram illustrating a method of selective metal residue and liner cleanse for post-subtractive etch in one embodiment. An example process 700 may include one or more operations, actions, or functions as illustrated by one or more of blocks 702, 704, 706, 708, and/or 710. Although illustrated as discrete blocks, various blocks can be divided into additional blocks, combined into fewer blocks, eliminated, or performed in parallel, depending on the desired implementation.

The process 700 can begin at block 702. At block 702, a hard mask layer of a deposition stack can be etched to pattern a hard mask. The process 700 can proceed from block 702 to block 704. At block 704, an interconnect layer of the deposition stack can be etched using the hard mask to pattern a plurality of metal lines. In one embodiment, a hydrogen anneal process can be applied to remove metal oxide deposited on the metal lines in response to etching the interconnect layer. In one embodiment, the metal lines can be ruthenium (Ru) metal lines. In one embodiment, an etch stop layer can be deposited directly on the interconnect layer, a cap layer can be deposited directly on the etch stop layer, and the hard mask layer can be deposited directly on the etch stop layer. The hard mask can be used for etching of the interconnect layer, the etch stop layer, and the cap layer.

The process 700 can proceed from block 704 to block 706. At block 706, the hard mask can be removed. In one embodiment, the hard mask can be removed by removing portions of the etch stop layer and the cap layer remaining on the metal lines. In one embodiment, etching the interconnect layer, the etch stop layer, and the cap layer can include applying a dry and anisotropic etch process. In one embodiment, removing the hard mask can include applying a timed wet etch process. In one embodiment, the timed wet etch process uses diluted hydrofluoric (DHF).

The process 700 can proceed from block 706 to block 708. At block 708, a liner layer of the deposition stack can be etched to remove a portion of the liner layer deposited directly on a dielectric layer of the deposition stack. In one embodiment, a material of the liner layer can be tantalum nitride (TaN). In one embodiment, the liner layer can be etched by applying a selective wet etch process. In one embodiment, the selective wet etch process can include using an etch rate for the liner layer that is greater than an etch rate of the metal lines. In one embodiment, the selective wet etch process can be a timed wet etch process.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be performed substantially concurrently, or the blocks may sometimes be performed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements, if any, in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A method for forming interconnect structures on a semiconductor device, the method comprising:
   etching a hard mask layer of a deposition stack to pattern a hard mask, wherein:
      an etch stop layer is deposited directly on an interconnect layer of the deposition stack;
      a cap layer is deposited directly on the etch stop layer;
      the hard mask layer is deposited directly on the etch stop layer;
   etching interconnect layer, the etch stop layer and the cap layer of the deposition stack using the hard mask to pattern a plurality of metal lines;
   removing the hard mask; and
   etching a liner layer of the deposition stack to remove a first portion of the liner layer deposited directly on a dielectric layer of the deposition stack, and in response to etching the liner layer, a second portion of the liner layer remains between the plurality of metal lines and the dielectric layer.

2. The method of claim 1, further comprising applying a hydrogen anneal process to remove metal oxide deposited on the metal lines in response to etching the interconnect layer.

3. The method of claim 1, wherein the metal lines are ruthenium (Ru) metal lines.

4. The method of claim 1, wherein a material of the liner layer is tantalum nitride (TaN).

5. The method of claim 1, wherein removing the hard mask comprises removing portions of the etch stop layer and the cap layer remaining on the metal lines.

6. The method of claim 1, wherein etching the interconnect layer, the etch stop layer, and the cap layer comprises applying a dry and anisotropic etch process.

7. The method of claim 1, wherein removing the hard mask comprises applying a timed wet etch process.

8. The method of claim 7, wherein the timed wet etch process uses diluted hydrofluoric (DHF).

9. The method of claim 1, wherein etching a liner layer comprises applying a selective wet etch process.

10. The method of claim 9, wherein the selective wet etch process comprises using an etch rate for the liner layer that is greater than an etch rate of the metal lines.

11. The method of claim 9, wherein the selective wet etch process is a timed wet etch process.

* * * * *